United States Patent [19]
Drake

[11] Patent Number: 6,030,060
[45] Date of Patent: Feb. 29, 2000

[54] ADJUSTABLE CIRCUIT CARD STORAGE DEVICE

[76] Inventor: Leo O. Drake, Ridge La. Tall Oaks, Mill Neck, N.Y. 11765

[21] Appl. No.: 09/120,765

[22] Filed: Jul. 22, 1998

[51] Int. Cl.[7] .................................................. A47B 45/00
[52] U.S. Cl. ....................... 312/205; 211/41.17; 361/756; 206/708
[58] Field of Search ................ 312/205; 220/8; 190/104, 105; 206/708; 211/41.17, 175; 108/147; 361/752, 759, 756; 248/279.1, 316.4, 316.8, 447.2

[56] References Cited

U.S. PATENT DOCUMENTS

| | | | |
|---|---|---|---|
| 1,243,750 | 10/1917 | Miller | 108/147 |
| 1,982,680 | 11/1934 | Tindale | 108/147 |
| 3,014,594 | 12/1961 | Kerstner . | |
| 4,184,599 | 1/1980 | Drake et al. . | |
| 4,277,120 | 7/1981 | Drake et al. . | |
| 4,558,398 | 12/1985 | Drake . | |
| 4,664,265 | 5/1987 | George, Jr. . | |
| 4,746,015 | 5/1988 | Kaucic . | |
| 4,854,430 | 8/1989 | Petersen | 220/8 |
| 5,008,779 | 4/1991 | Salmon . | |
| 5,168,431 | 12/1992 | Moulton et al. . | |

*Primary Examiner*—Peter M. Cuomo
*Assistant Examiner*—Gerald A. Anderson
*Attorney, Agent, or Firm*—Hoffman & Baron, LLP

[57] ABSTRACT

An adjustable circuit card storage device including a first and second support member which are substantially parallel and opposingly spaced from one another and defining a space for accommodating a plurality of circuit cards substantially normally there between. A pair of spaced adjustment plates extending between and adjustably connecting the first and second support members together to permit the spacing therebetween to be adjusted. A first adjustment assembly including a first part rotatably secured to one of the first and second support members and a second part formed in one of the pair of adjustment plates. The first part being operatively engaged with the second part such that rotation of the first part adjusts the spacing between the first support member and the second support member.

23 Claims, 4 Drawing Sheets

ADJUSTABLE CIRCUIT CARD STORAGE DEVICE

FIELD OF INVENTION

The present invention relates to devices for retaining and storing printed circuit cards. More particularly, the present invention relates to a device for retaining and storing printed circuit cards having a vertical adjustment mechanism for providing fine dimensional control over the printed circuit card receiving space.

BACKGROUND OF THE INVENTION

The use of printed circuit cards or boards is particularly advantageous in facilitating the rapid repair of malfunctioning electronic devices which include such circuit cards. The equipment may quickly be returned to service without removal from the operating site merely by unplugging and removing the printed circuit cards, one at a time, and substituting for the removed card a like printed circuit card known to be properly functional. After each substitution is made, the equipment is tested to see if that particular substitution has resulted in repair of the device. Thus, the faulty printed circuit card may quickly and easily be isolated and the same thereafter returned to a testing laboratory or facility for repair. Accordingly, the technician in the field requires only minimal skills for the removal and substitution of printed circuit cards and as such need have little or no knowledge of the actual electronics within the equipment. This frees individuals having valuable technical skills from equipment troubleshooting in the field so as to enable them to more effectively utilize their time for circuit development and the like.

As a consequence, it is particularly advantageous to maintain a large supply of spare, properly functional printed circuit cards at locations where such cards are in constant use, such as telephone switching stations and the like. It is likewise often important to maintain a supply of printed circuit cards for performing alternative functions different from those normally performed by the operating equipment, as in a telephone office where a customer desiring additional features on his phone line may be accommodated merely by the substitution of a printed circuit card having the additional capabilities for the one formerly provided on the line without time-consuming and expensive rewiring.

Devices for storing printed circuit cards are well known in the art. Various storage devices have been developed which include adjustable card receiving spaces to accommodate circuit cards having varying heights. For example, U.S. Pat. Nos. 4,184,599 and 4,277,220 disclose printed circuit card storage devices which are adjustable to accommodate a variety of card heights. Printed circuit cards are generally very delicate components and proper storage requires that the cards be securely held in place but not subjected to undue pressure which may warp or otherwise damage the card. The proper adjustment of card receiving space in the above listed patents can be difficult and time consuming since no device is provided for aiding the fine adjustment of the card receiving space to ensure that the card is properly secured.

U.S. Pat. No. 5,168,431 describes a height adjusting mechanism for a circuit card storage device which permits for fine adjustment of the card receiving space. However, the mechanism involves several moving parts and is therefore, unduly complicated and occupies a considerable amount of vertical space which would ideally be used for storing cards.

Accordingly, it would be desirable to provide an adjustable circuit card storage device having a printed circuit card receiving space which can be easily, finely adjusted to properly secure the cards within.

SUMMARY OF THE INVENTION

It is an object of the present invention to provide an adjustable circuit card storage device.

It is a further object of the invention to provide an adjustable circuit card storage device having an upper and lower support surfaces, the distance between the surfaces being finely adjustable to properly and safely secure a printed circuit card therebetween.

It is yet a further object of the present invention to provide an adjustable circuit card storage device having an adjustment assembly disposed on each end of the storage device to permit controlled and even movement between the upper and lower support surfaces.

In the attainment of these and other objectives the present invention provides an adjustable circuit card storage device having a first and second support member being substantially parallel and opposingly spaced from one another and defining a space for accommodating a plurality of circuit cards substantially normally there between. The first support member has a pair of sidewalls depending therefrom and extending toward said second support member. The second support member has a pair of spaced sidewalls depending therefrom and extending toward said first support member. A pair of adjustment plates extend between said first and second support members, and each of said pair of adjustment plates is disposed adjacent one of said pair of sidewalls of said first and second support member. The present invention further provides a first adjustment assembly including a first part rotatably secured in one of said sidewalls and a second part formed in one of said pair of adjustment plates adjacently disposed thereto. The first part is operatively engaged with said second part such that rotation of said first part adjusts the spacing between said first support member and said second support member.

In the preferred embodiment the first part includes a toothed wheel and said second part includes a linear array of spaced teeth whereupon rotation of said toothed wheel results in movement of said first support member relative to said second support member thereby adjusting the distance there between. The at least one of said pair of adjustment plates includes an elongate vertical slot formed therein, such slot being defined by a pair of spaced sidewalls, and wherein one of said linear array of teeth is formed on said one of said slot sidewalls.

A preferred form of the adjustable circuit card storage device, as well as other embodiments, objects, features and advantages of this invention, will be apparent from the following detailed description of illustrative embodiments thereof, which is to be read in connection with the accompanying drawings.

DETAILED DESCRIPTION OF THE PREFERRED EMBODIMENTS

Figure 1:
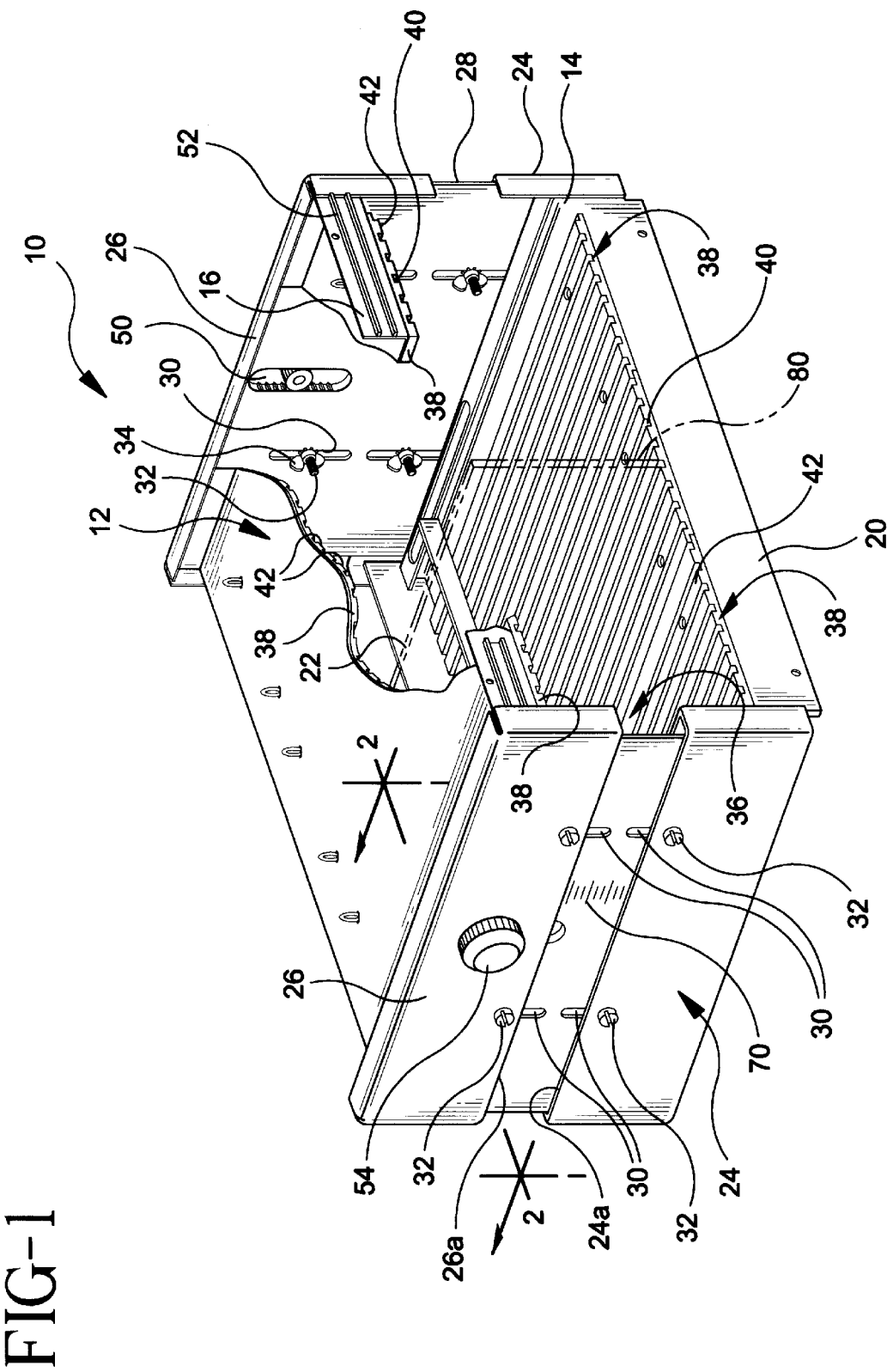
FIG. 1 is a side perspective view of the circuit card storage device of the present invention having a portion removed for clarity.

An embodiment of a storage device demonstrating objects and features of the present invention is shown in the drawings. There is more particularly seen in FIGS. 1 and 2 a printed circuit card storage device designated by the general reference numeral 10 and including a pair of substantially parallel and opposingly spaced apart support surfaces 12, 14 between which is formed a card receiving space for accommodating circuit cards or boards 80 in a manner hereinafter described. The upper support surface 12 and the oppositely-disposed lower surface 14 are each formed as substantially flat, plate-like members and are preferably devoid of independent reinforcing or strengthening elements or structures secured thereto along their flat support or major surfaces. The general configuration of the storage device of the present invention is described in U.S. Pat. Nos. 4,277,120 and 4,184,599 which are both incorporated by reference herein.

Upper support surface 12 has its respective forward and rearward edge portions 16, 18 oppositely bent or turned so as to dispose each such edge portion substantially perpendicular to the surface 12. The same is true of the front and rear-disposed edge portions 20, 22 of the lower support surface 14 which are similarly turned or bent. As seen in FIG. 1, each of the forward edge portions 16, 20 of the respective support surfaces 12, 14 are bent away from the oppositely disposed surface and from each other while the rear edge portions 18, 22 are turned toward each other.

The lower and upper support surfaces 12, 14 carries and supports a pair of sidewalls 24, 26, respectively, substantially normally depending from its opposite ends and extending in the direction of the respectively opposed support surface. Each pair of sidewalls 24, 26 on one of the support surfaces 12, 14 is identically configured and arranged for cooperative engagement with a mutually oppositely disposed one of the sidewalls on the other of the support surfaces. Thus, each of the sidewalls 26 of the upper support surface 12 are arranged for engagement with one of the sidewalls 24 of the lower support surface 14.

An adjustment device comprising a substantially flat adjustment plate 28 is provided between the mutually oppositely disposed sidewalls 24, 26 for connecting the same and for enabling the adjustable selection of the spacing between the opposed support surfaces 12, 14. In other words, the adjustable plate 28 is arranged to provide the ability of continuously vary the spacing between the opposed support surfaces 12, 14 from a minimum to a maximum position and selectively there-between while insuring that throughout the adjustment range the support surfaces 12, 14 are maintained in substantial alignment for supported retention of printed circuit cards.

Figure 3:
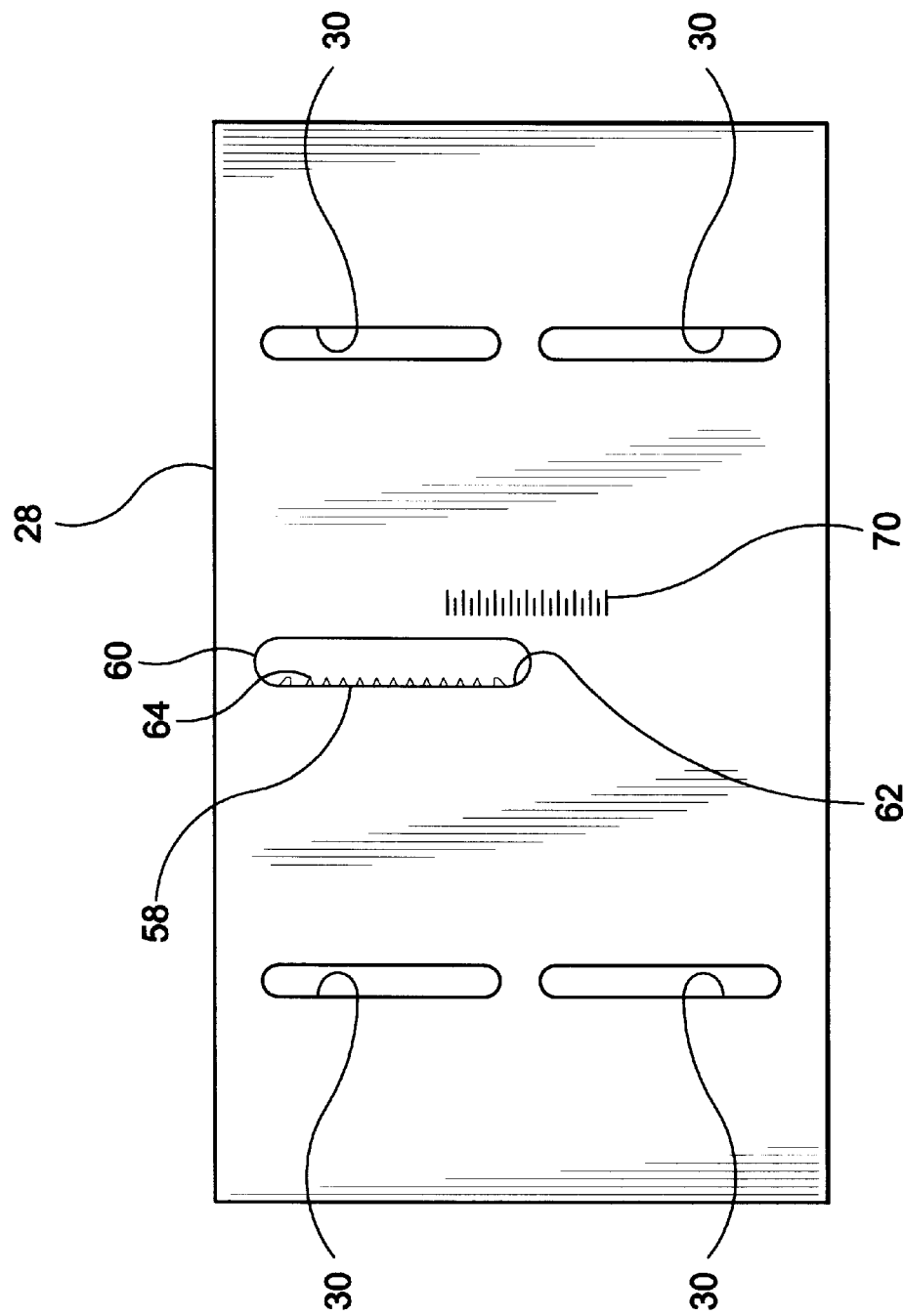
FIG. 3 is a side elevational view of the adjustment plate of the present invention.
Figure 4:
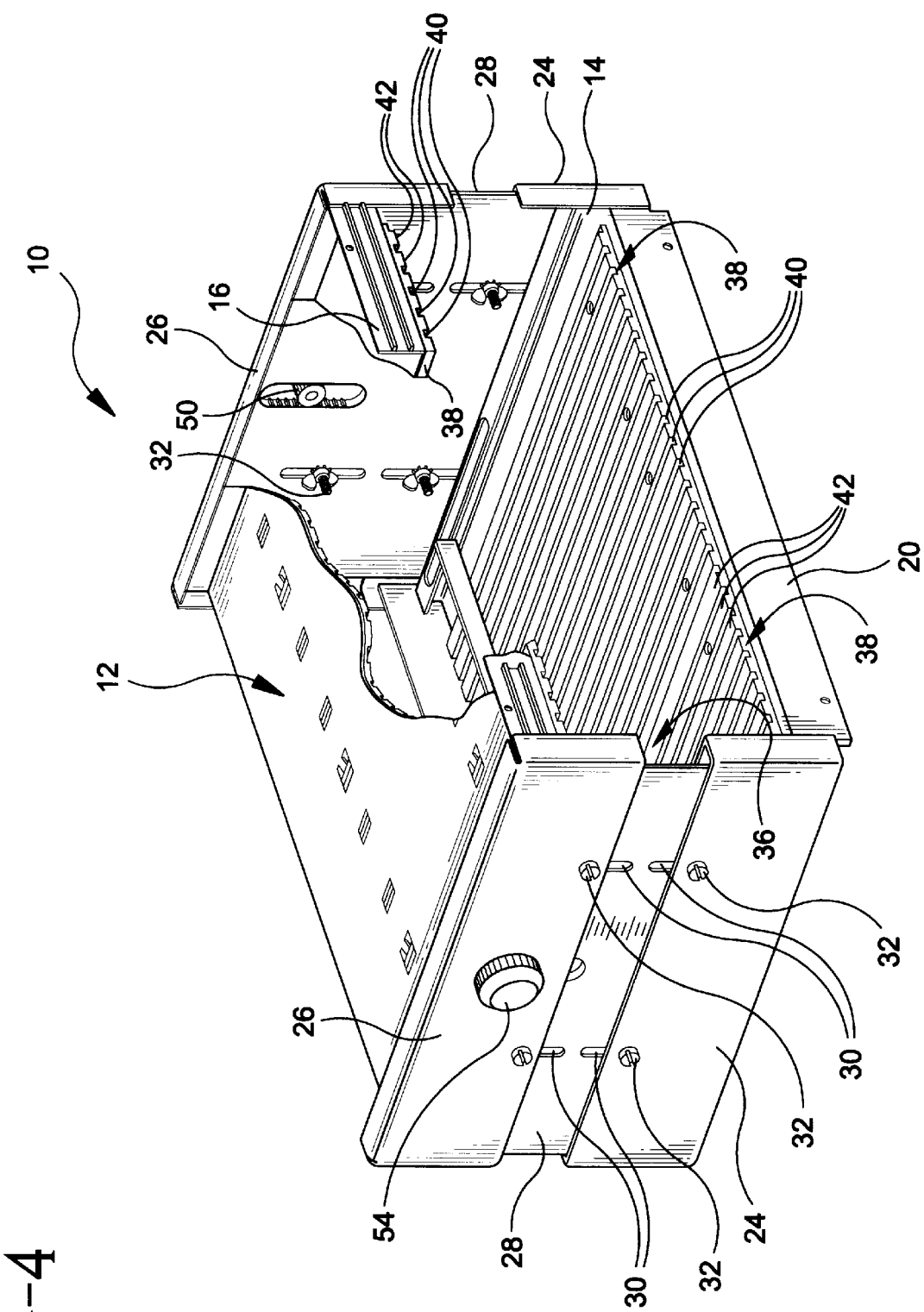
FIG. 4 is a side perspective view of an alternative embodiment of the circuit card storage device of the present invention with a portion removed for clarity.

As seen in FIG. 3, each adjustment plate 28 includes a plurality of parallel elongated slots 30 defined through the plate to provide for an adjustable connection with the sidewalls 24, 26. For this purpose, each of the sidewalls includes plural throughbores, each located for cooperative alignment with a corresponding one of the slots 30 on the adjustment plate 28 so as to define an alignment passageway for each bore and slot pair.

A screw 32 journalled through the alignment passageway completes the connection between the adjustment plates and the cooperating sidewalls. A hand-rotatable wing nut 34 is threaded on each screw for retention of the screws in their respective passageways and the wing nuts can be tightened on their respective screws so as to constitute a locking means for maintaining a selected adjustment of the spacing between the opposed support surfaces. Thus, a loosening rotation of at least some of the wing nuts relative to their cooperatively-engaged screws enables relative movement of the mutually oppositely disposed sidewalls as the screws ride along their respective slots. The spacing is therefore, selectively adjustable to a predetermined height or position. Once the final spacing is achieved by way of the fine adjustment assembly 50 described below, the spacing may be retained merely by a retightening or counter-rotation of the wing nuts on and relative to the cooperating screws.

With the wing nuts loosened, coarse adjustment of the space between the upper and lower surfaces 12, 14 may be achieved by manually urging the surfaces 12, 14 toward or away from each other. However, printed circuit cards are typically very delicate components which must be properly secured to avoid damage. Proper storage requires that the cards be retained to prevent movement thereof, yet the cards should not be subjected to undue stresses. Accordingly, the spacing between support surfaces 12, 14 is preferably precisely controllable. In order to provide the fine adjustment of the spacing between upper and lower support surfaces 12, 14, the present invention provides a fine adjustment assembly 50. In the preferred embodiment, best shown in FIG. 1, a pair of fine adjustment assemblies 50 are provided with one of the pair being disposed on each side of storage device 10. The placement of the adjustment assemblies on the sides of storage device 10 permits the storage units to be vertically stacked and does not reduce the amount of vertical storage space which is available for card storage.

Figure 2:
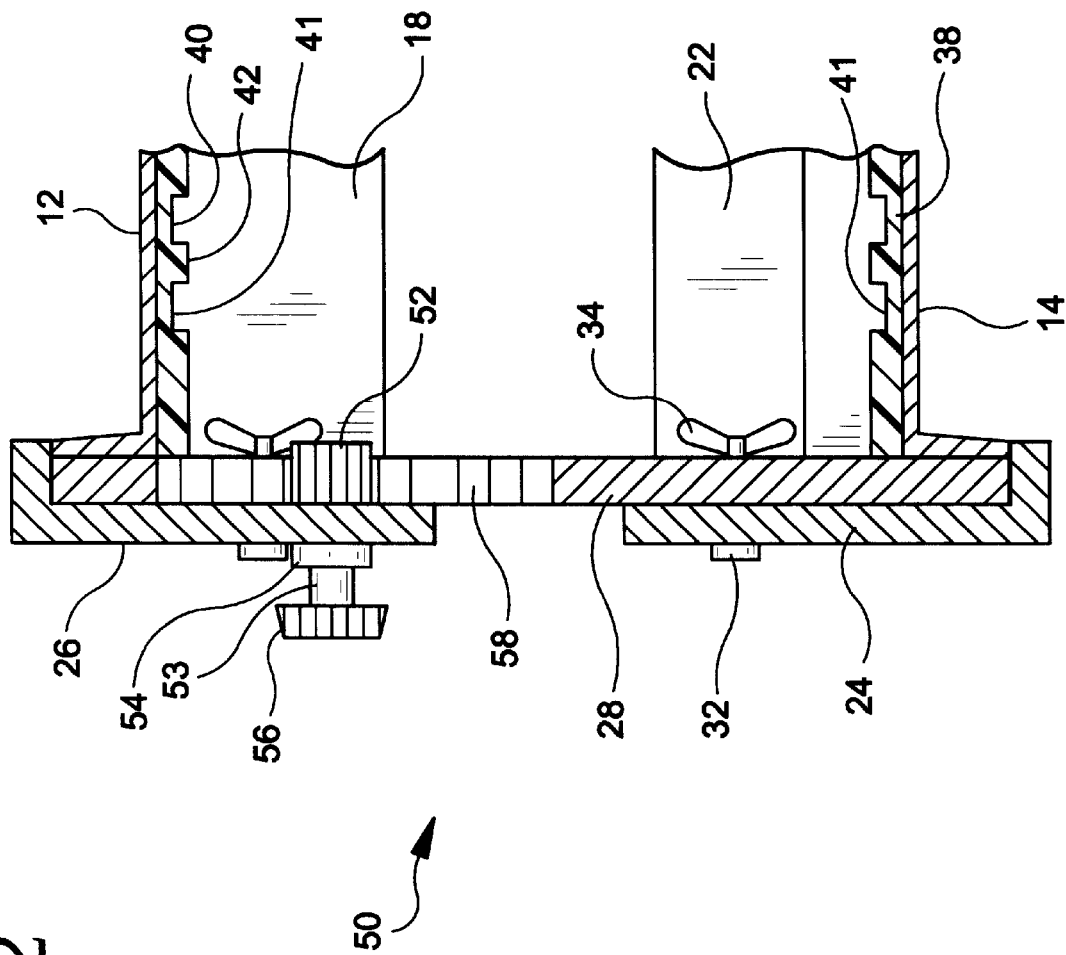
FIG. 2 is a partial cross-sectional view of the fine adjustment assembly taken of FIG. 1 along line 2—2 thereof.

As shown in FIGS. 1 and 2, adjustment assembly 50 preferably includes a rack and pinion type arrangement with the gear-like pinion 52 being formed on one end of a knob 54. Knob 54 is rotatably secured on sidewall 26 of the upper support. A linear array of teeth form rack 58 on adjustment plate 28. Knob 54 is preferably rotatably secured or journalled in sidewall 26 in any manner well known in the art. For example, a C-clip may be inserted on the reduced diameter section on either side of sidewall 26 thereby preventing the knob from translating with respect to sidewall 26 and maintaining pinion 52 in working contact with rack 58. Pinion 52 is preferably positioned adjacent the inside surface of sidewall 26 and extends inwardly toward the card receiving space no greater than the ends of screws 32 or wing nuts 34 as not to interfere with the cards stored within.

Extending outwardly beyond sidewall 26, the other end of knob 54 may include a knurled wheel 56 which provides a gripping surface for an operator to turn the knob. Knob 54 either be integrally formed from one piece, or may be formed as two separate parts with one part being pinion 52 and the other part being the wheel portion having a reduced diameter section 53 extending through sidewall 26 and being fixably secured to pinion 52. Knob 54 is preferably formed of machined steel but it is within the contemplation of the present invention that knob 54 may be formed from a wide variety of materials including metallic and nonmetallic.

Pinion 52 is configured to cooperatively engage rack 58 formed on adjustment plate 28. Each of the adjustment plates 28 preferably includes a longitudinally centrally disposed elongate slot 60. Slot 60 is preferably formed on the upper portion of plate 28 between slots 30 having a length approximately that of slots 30. The precise dimensions of slot 60 may be chosen to permit the widest range of motion of upper support surface 12 relative to lower surface 14. Slot 60 is defined by spaced sidewalls 62, and one of sidewalls 62 includes an array of spaced teeth 64 forming rack 58. The spacing between the teeth, or pitch, is such that it cooperates with the spacing of the teeth formed on pinion 52. A pitch of approximately 20 teeth per inch has been found to provide an acceptable degree of adjustment control thereby permitting an operator precisely adjust the spacing between the upper and lower support surfaces 12, 14. However, it is within the contemplation of the present invention that the pitch may be varied in order to achieve the desired sensitivity of adjustment. Adjustment plate 28 is preferably formed out of a steel sheet with slots 30, 60 and rack 58 being punched into the sheet. However, it is within the contemplation of the present invention that the plates may be formed from a wide variety of metallic and nonmetallic materials with the slots being formed in any manner well known in the art.

A pair of fine adjustment assemblies 50 are preferably included with one included on each side of storage device 10 to ensure that upper and lower support surfaces 12, 14 remain parallel to each other upon adjustment of the spacing in order to avoid improper securement of the printed circuit cards.

Printed circuit cards to be stored within storage device 10 are intended to be retained substantially normally between the parallel and opposingly spaced support surfaces 12, 14, and consequently substantially parallel to the sidewalls 24, 26 and connecting adjustment plates 28. To effect this supported relation of printed circuit cards, a plurality of circuit card guide or retaining plates individually and collectively designated 38 are supported or carried on the interior-defined surface of each of the support surfaces 12, 14. Thus, the retaining plates 38 are oppositely and facingly disposed within the interior of the storage device 10 along the upper and lower support surfaces 12, 14.

It is preferred that each of support surfaces 12, 14 support several of the retaining plates 38, and FIG. 1 illustrates three such plates carried on each of the support surfaces. It is, on the other hand, fully within the scope and contemplation of the invention to provide only a single retaining plate 38 on each support surface 12, 14. In any event, despite differences in the sizing of or spacing between certain of the elements comprising each of the retaining plates 38, the general arrangement of each of the individual plates 38 is otherwise identical and hence the following description thereof is applicable to any single retaining plate 38 carried on either of the support surfaces 12, 14 whether the surface carries only one, or several, plates 38 thereon.

As shown in FIG. 1, each of the circuit card retaining plates, 38 is substantially flat and planar and includes a plurality of parallel grooves or channels 40 continuously defined between opposite edges of the plate 38. Each of the grooves 40 is of substantially uniform width along its length and it is intended that the width of all of the grooves on a retaining plate 38 be the same. The width is defined by a groove transverse portion 41. Adjacently disposed ones of the grooves 40 separate relatively upstanding lands 42 which, like the grooves, extend fully and continuously between the opposite edges of the retaining member. When mounted on or secured to the support surfaces 12, 14, the orientation of the retaining plates 38 is such that the grooves or channels 40 are disposed parallel to the sidewalls 24, 26 and extend continuously from the cabinet's frontal opening 36 to its rearwardly-disposed or back end.

Each of the grooves 40 constitutes one half of a printed circuit card or card guide for slidably receiving an edge of a circuit card. Thus, the edges of a circuit card inserted into the cabinet 10 through its frontal opening 36 are slidably received in and guided along a pair of mutually oppositely disposed and facing grooves 40 of opposed retaining plates 38 carried on the respective support surfaces 12, 14. It will accordingly be recognized that each mutually opposed pair of grooves or channels 40 accommodating the edges of a circuit card should be disposed in relative alignment so as to retain the circuit card substantially normally between the support surfaces 12, 14. Moreover, this alignment is preferably maintained at all times irrespective of the selectively variable spacing between the opposed support surfaces 12, 14.

Retaining plates 38 may be secured to the supports surfaces 12, 14 in a variety of manners including those set forth in U.S. Pat. Nos. 4,277,120 and 4,558,398 both of which are incorporated by reference herein. In addition, support surfaces 12, 14 may include a series of spaced slots formed in the support surfaces themselves as set forth in U.S. Pat. No. 4,184,599 which has been incorporated by reference herein.

Operation of the adjustable storage device 10 will now be described. In order to properly secure a printed circuit card in storage device 10, the upper and lower supports 12, 14 are urged apart after the loosening of the screw and wing nut combinations. Movement between lower support surface 14 and adjustment plates 28 is substantially free and unrestricted in the vertical direction when the wing nuts are loosened. In addition, the pitch of the rack and pinion combination is such that movement of upper support surface 12 relative to adjustment plates 28 is permitted without the need to manually turn knob 54. When the opening space is sufficiently great to easily receive circuit card 80, the card may be placed within the space between the upper and lower support surfaces 12, 14 so that the bottom of the edge of the card sits within one of grooves 40. Once the card is in place, the coarse adjustment may then take place. This involves manually urging upper support surface 12 toward lower support surface 14 such that circuit card 80 enters the corresponding groove formed on the upper support surface 12.

During this course adjustment, the engagement between the rack and pinion allows for controlled motion of upper support surface 12. Once the upper and lower surfaces have been coarsely adjusted, the screw and wing nut combinations attaching lower support surface 14 to plate 28 may be tightened in order to secure lower support surface 14 to the adjustment plates 28. Fine adjustment of the spacing between upper and lower support surfaces 12, 14 may then be achieved by simultaneously rotating the pair of knobs 54 which results in controlled movement of upper support surface 12. By tightening the screw and wing nut fasteners of the bottom support to adjustment plates 28, the adjustment plates are fixed, therefore, rotation of knob 54 will cause pinions 52 and upper support surface 12 to move relative to lower support surface 14. The movement of upper support surface 12 which occurs upon rotation of knob 54 is guided by screws 32 which extend through sidewalls 26 and adjustment plates 28 as shown in FIG. 2. Proper final adjustment is achieved by rotating knobs 54 until the upper edge of the printed circuit card just barely engages groove transverse portion 41 formed on the upper support surface. By placing a minimal amount of pressure on the printed circuit card, it will remain securely in place without suffering damage. Once the proper spacing is achieved between the upper and lower support surfaces, the spacing can be fixed by tightening down wing nut 34.

In order to insure that upper and lower supports 12, 14 are in precise parallel arrangement, each adjustment plate 28 may include thereon a scale 70. Scale 70 may include indicia such as a series of hash marks which may or may not be numbered. Scale 70 is positioned on the side plate such that it is visible between the lower edge 26a of upper sidewall 26 and upper edge 24a bottom sidewall 24. Scales 70 may be fixed on adjustment plates 28 in a variety of manners including stamping screening or by use of a label. An operator may use the scale to insure that the distance between the edges of the upper and lower sidewalls are equal on each side of the storage device in order to insure that the upper and lower support surfaces 12, 14 are parallel. Maintaining precise parallel orientation between the upper and lower support surfaces 12, 14 will ensure that the pressure exerted on the printed circuit cards will be uniform regardless of which groove the cards are located in.

Various changes to the foregoing described and shown structures would now be evident to those skilled in the art. Accordingly, the particularly disclosed scope of the invention is set forth in the following claims.

What is claimed is:

1. An adjustable circuit card storage device comprising:
    a first and second support member being substantially parallel and opposingly spaced from one another and defining a space for accommodating a plurality of circuit cards substantially normally there between;
    said first support member having a pair of sidewalls depending therefrom and extending toward said second support member, said second support member having a pair of spaced sidewalls depending therefrom and extending toward said first support member;
    a pair of adjustment plates extending between said first and second support members, each of said pair of adjustment plates being disposed adjacent one of said pair of sidewalls of said first and second support member; and
    a first adjustment assembly including a first part rotatably secured in one of said sidewalls and a second part formed in one of said pair of adjustment plates adjacently disposed thereto, said first part being operatively engaged with said second part such that rotation of said first part adjusts the spacing between said first support member and said second support member.

2. The storage device as defined in claim 1 wherein said first part includes a toothed wheel and said second part includes a linear array of spaced teeth whereupon rotation of said toothed wheel results in movement of said first support member relative to said second support member thereby adjusting the distance there between.

3. The storage device described in claim 2, wherein said at least one of said pair of adjustment plates includes an elongate vertical slot formed therein, such slot being defined by a pair of spaced sidewalls, and wherein one of said linear array of teeth is formed on said one of said slot sidewalls.

4. The storage device as defined in claim 3 wherein said toothed wheel includes a portion extending outwardly from an exterior side of said sidewall said exterior portion providing a gripping surface to permit manual rotation of said toothed wheel.

5. The storage device as defined in claim 3 wherein said at least one of said pair of adjustment plates includes an upper half and said linear toothed portion is formed substantially on said upper half, and said toothed wheel being rotatably secured on a sidewall of said upper support member.

6. The storage device as defined in claim 1 wherein said upper and lower support members include a plurality of spaced channels for receiving edges of the circuit card.

7. The storage device as defined in claim 1 wherein each of said pair of adjustment plates is vertically translationally secured to said sidewalls of said first and second members to which said members are adjacently disposed such that said first and second support members may freely move vertically in a guided manner relative to said adjustment plates.

8. The storage device as defined in claim 1 further including a second adjustment assembly disposed on a side of the storage device opposite that of said first adjustment assembly.

9. The storage device as defined in claim 8 wherein said second adjustment assembly is similarly formed to said first adjustment mechanism.

10. The storage device as defined in claim 1 wherein said upper and lower support members each include a plurality of spaced substantially parallel channels having a width, said channels adapted to support edges of a printed circuit card having a thickness corresponding to said width of said channels.

11. The storage device as defined in claim 1 wherein said pair of adjustment plates forms an adjustable connection between said upper and lower support members.

12. The storage device as defined in claim 11 wherein said each of said pair of adjustment plates includes a pair of spaced slots formed thereon, said pair of slots cooperating with a pair of elongate members extending through a sidewall of said upper support member and said lower support member wherein one of said pair of elongate members extends through each of said pair of slots thereby permitting guided vertical movement between said upper and lower support members relative to said pair of adjustment plates.

13. The storage device as defined in claim 1 wherein said at least one of said pair of adjustment plates includes a second elongate slot formed therein and one of said sidewalls includes a threaded member extending therethrough and into said second slot such that said threaded member guides the movement between the support member and said at least one of said pair of adjustment plates.

14. The storage device as defined in claim 13 further including a threaded nut cooperatively received on said threaded member such that advancement of said nut on said threaded member restricts movement between said at least one adjustment plate thereby limiting adjustment of the distance between said first an second support members.

15. The storage device as defined in claim 1 further including a first blocking device being supported on said first support member and selectively restricting movement between said first support member and said pair of adjustment plates.

16. The storage device as defined in claim 15 further including a second blocking device being supported on said second support member and selectively restricting movement between said second support member and said pair of adjustment plates.

17. An adjustable circuit card storage device comprising:
    a first and second support member being substantially parallel and opposingly spaced from one another and defining a substantially unobstructed card receiving space having an opening for accommodating at least one circuit card substantially normally there between, said first and second support members being engagable with opposed edges of the at least one circuit card for retaining the at least one circuit card;
    a pair of spaced adjustment plates extending between and adjustably connecting said first and second support members together to permit the relative movement between said first and second support member to adjust the spacing there between; and a first adjustment assembly including a first part rotatably secured to one of said first and second support members and a second part supported on one of said pair of adjustment plates, said first part being operatively engaged with said second part such that rotation of said first part adjusts the spacing between said first support member and said second support member.

18. The storage device as defined in claim 17 further including a first blocking device being supported on said first support member and selectively restricting movement between said first support member and said pair of adjustment plates; and a second blocking device being supported on said second support member and selectively restricting movement between said second support member and said pair of adjustment plates.

19. A storage device as defined in claim 17 wherein said first part includes a toothed wheel forming a pinion and said second part includes a linear array of spaced teeth whereupon rotation of said pinion results in movement of said first support member relative to said second support member thereby adjusting the distance there between.

20. The storage device described in claim 19, wherein said adjustments plates include a scale formed thereon including a series of spaces indicia to provide indication of the degree of spacing between said first and second support surfaces.

21. The storage device described in claim 19, wherein said second part includes a linear array of spaced teeth forming a rack which cooperates with said pinion.

22. The storage device described in claim 21, wherein at least one of said pair of adjustment plates includes an elongate vertical slot formed therein, such slot being defined by a pair of spaced sidewalls, and wherein said rack is formed on said one of said slot sidewalls.

23. The storage device described in claim 21, wherein said first support member includes a wall extending therefrom, and said pinion is rotatably secured thereto.

* * * * *